(12) United States Patent
Tao et al.

(10) Patent No.: US 6,524,938 B1
(45) Date of Patent: Feb. 25, 2003

(54) METHOD FOR GATE FORMATION WITH IMPROVED SPACER PROFILE CONTROL

(75) Inventors: Hun-Jan Tao, Hsinchu (TW); Yuan-Hung Chiu, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 10/075,842

(22) Filed: Feb. 13, 2002

(51) Int. Cl.⁷ .......................................... H01L 21/3205
(52) U.S. Cl. ..................... 438/585; 438/592; 438/305
(58) Field of Search ................................ 438/585, 305, 438/618, 745, 299, 592, 647, 723

(56) References Cited

U.S. PATENT DOCUMENTS

| | | | |
|---|---|---|---|
| 5,741,738 A | | 4/1998 | Mandelman et al. ....... 438/296 |
| 5,923,991 A | | 7/1999 | Bronner et al. ............. 438/424 |
| 6,083,847 A | * | 7/2000 | Kuo ............................ 438/745 |
| 6,153,485 A | * | 11/2000 | Pey et al. .................... 438/305 |
| 6,207,513 B1 | | 3/2001 | Vollrath ....................... 438/296 |
| 6,291,331 B1 | * | 9/2001 | Wang et al. ................. 438/618 |
| 6,299,314 B1 | * | 10/2001 | Igarashi et al. ..................... 1/1 |
| 6,365,946 B1 | * | 4/2002 | Morgan et al. ............. 257/397 |

* cited by examiner

Primary Examiner—John F. Niebling
Assistant Examiner—Walter L. Lindsay, Jr.
(74) Attorney, Agent, or Firm—George O. Saile; Stephen B. Ackerman

(57) ABSTRACT

A new process is provided for the creation of an improved gate spacer profile. A layer of hardmask material is patterned over the surface of a layer of gate material. The layer of gate material is etch in accordance with the patterned layer of hardmask material, reducing the thickness of the patterned layer of hardmask material. A liner oxide is formed, a film of gate spacer material is deposited over the liner material. The layer of spacer material is etched, forming gate spacers and at the same time the remaining layer of hardmask material.

42 Claims, 5 Drawing Sheets

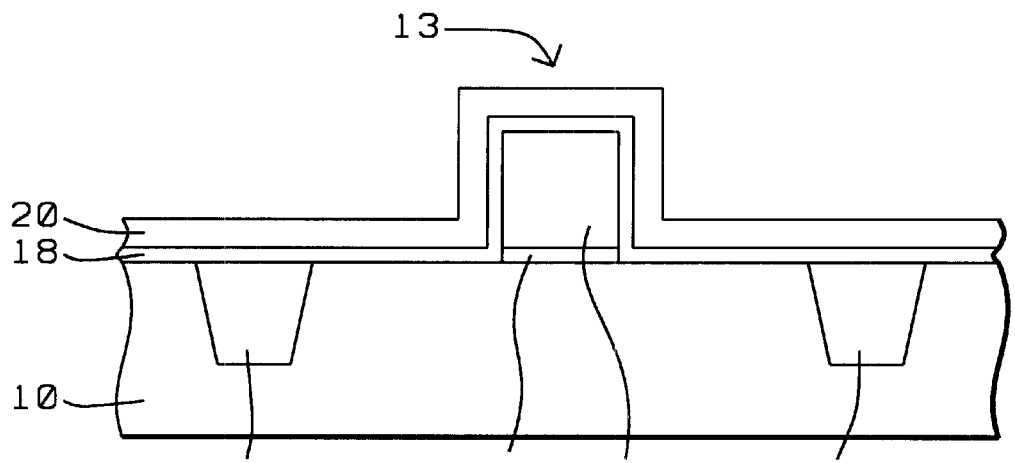
FIG. 1 – Prior Art
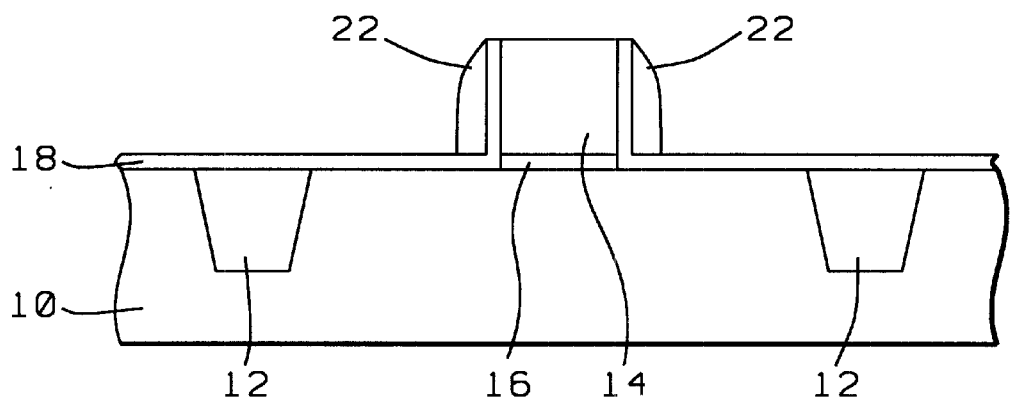
FIG. 2 – Prior Art
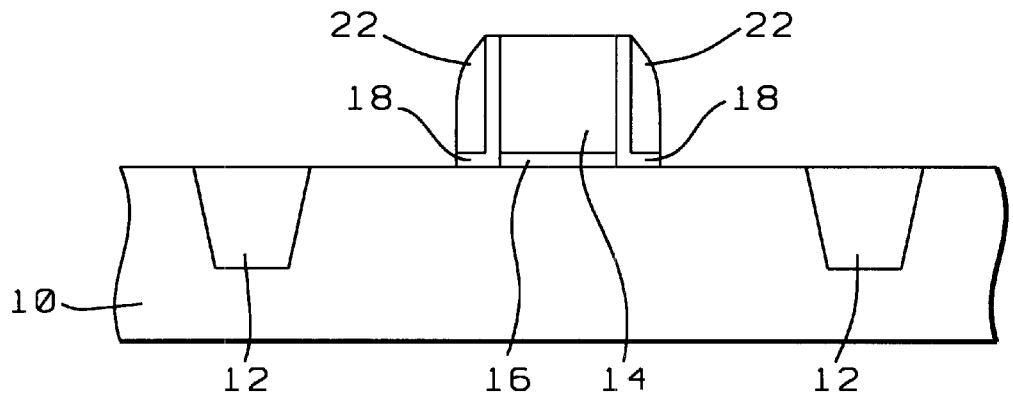
FIG. 3 – Prior Art

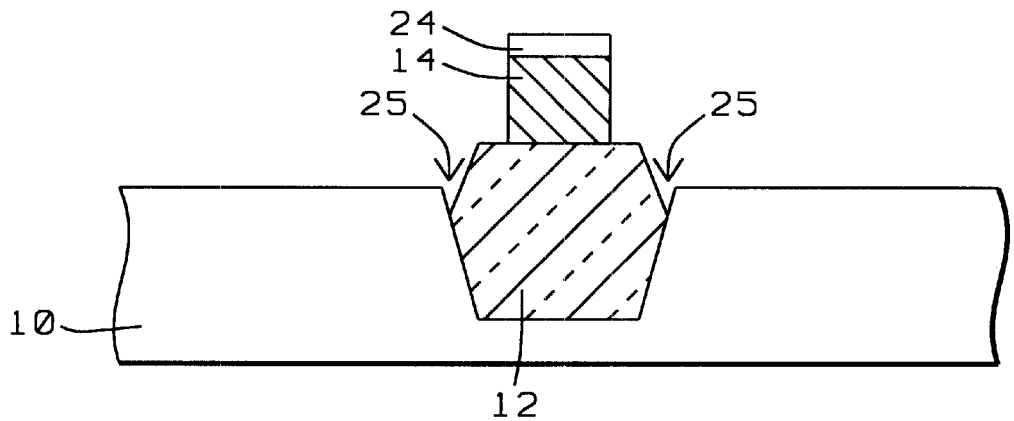
FIG. 4 — Prior Art
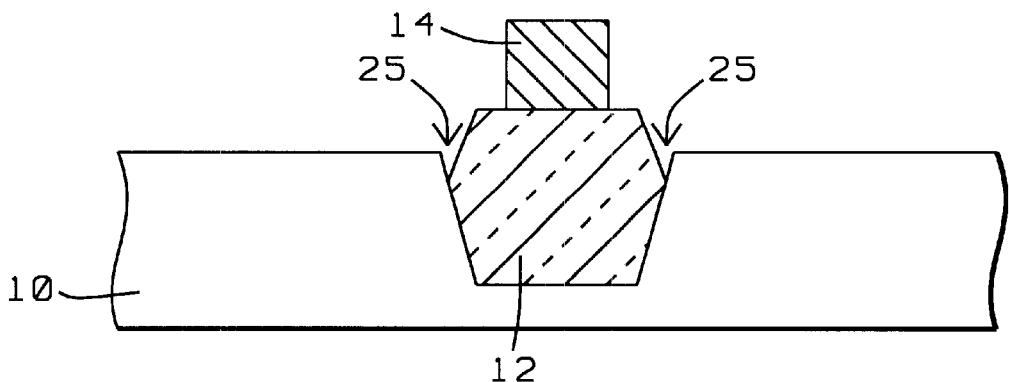
FIG. 5 — Prior Art
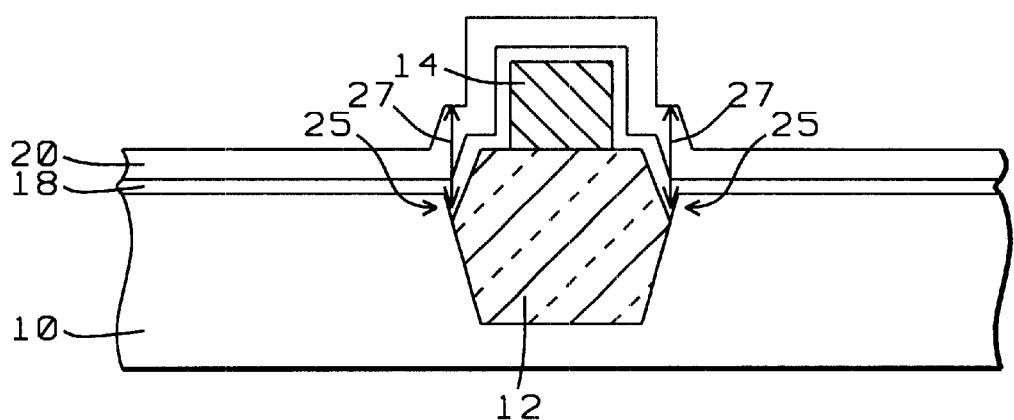
FIG. 6 — Prior Art

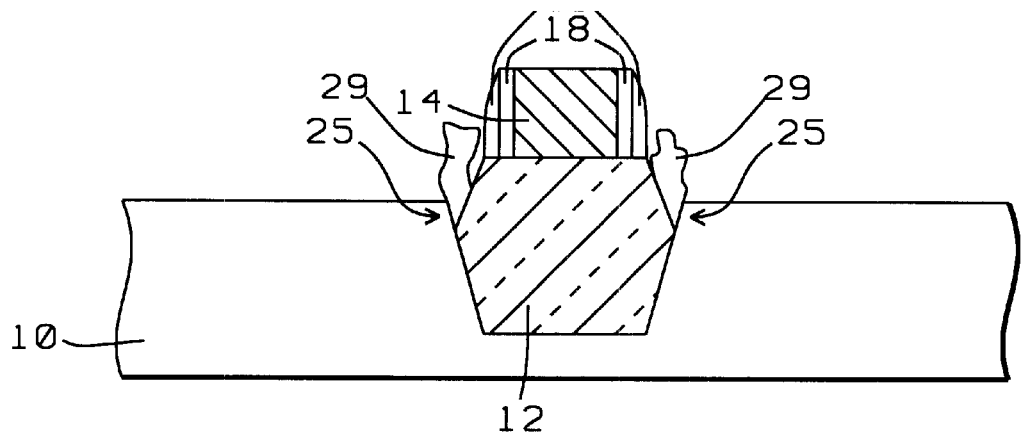
FIG. 7 - Prior Art
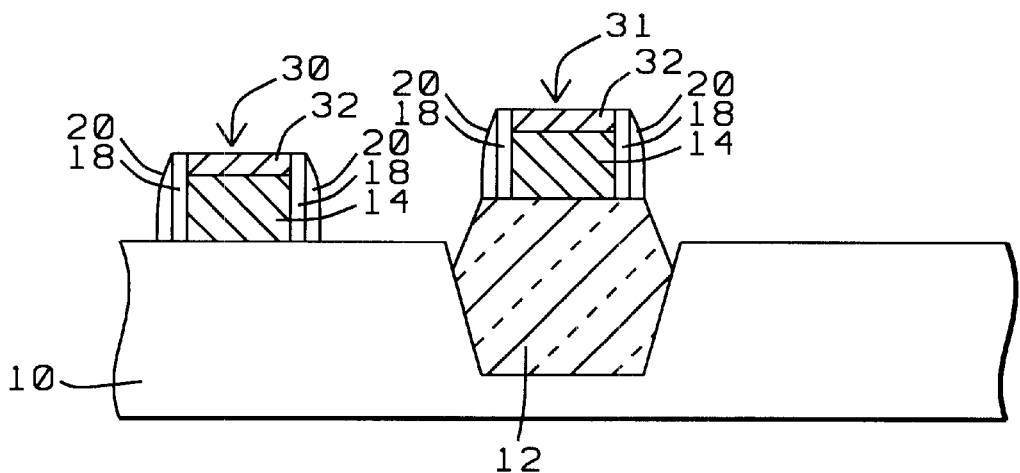
FIG. 8 - Prior Art
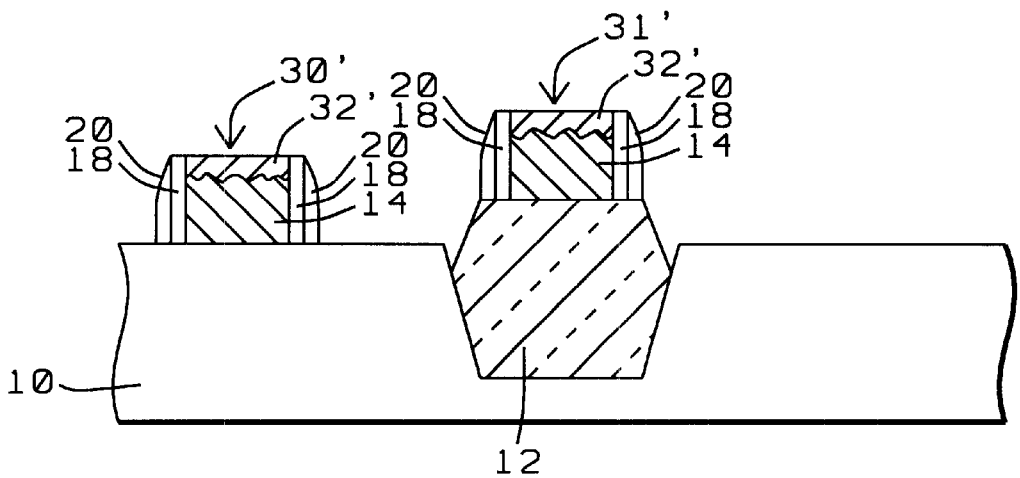
FIG. 9 - Prior Art

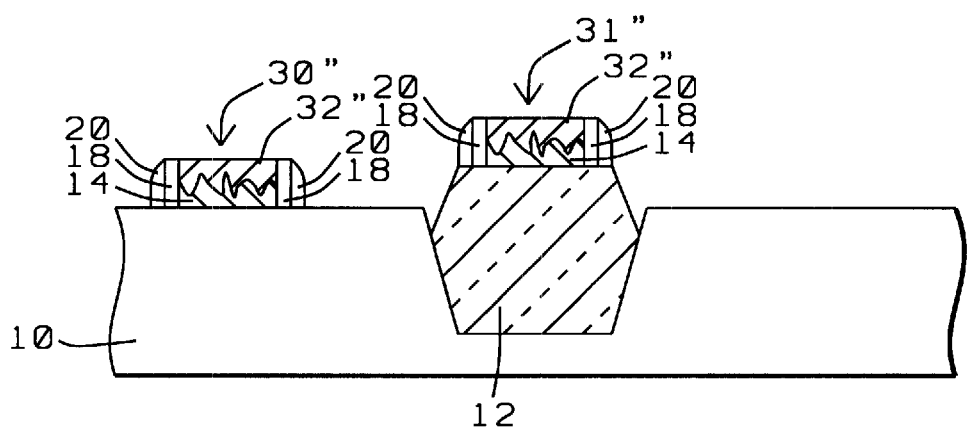
FIG. 10 – Prior Art
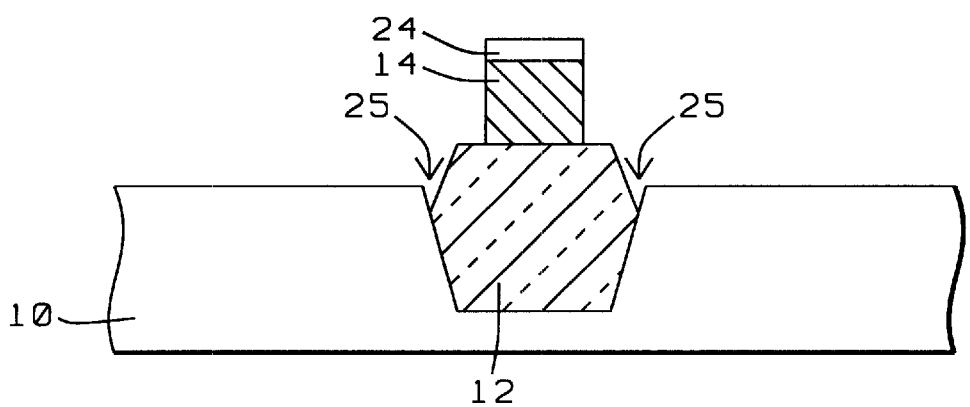
FIG. 11
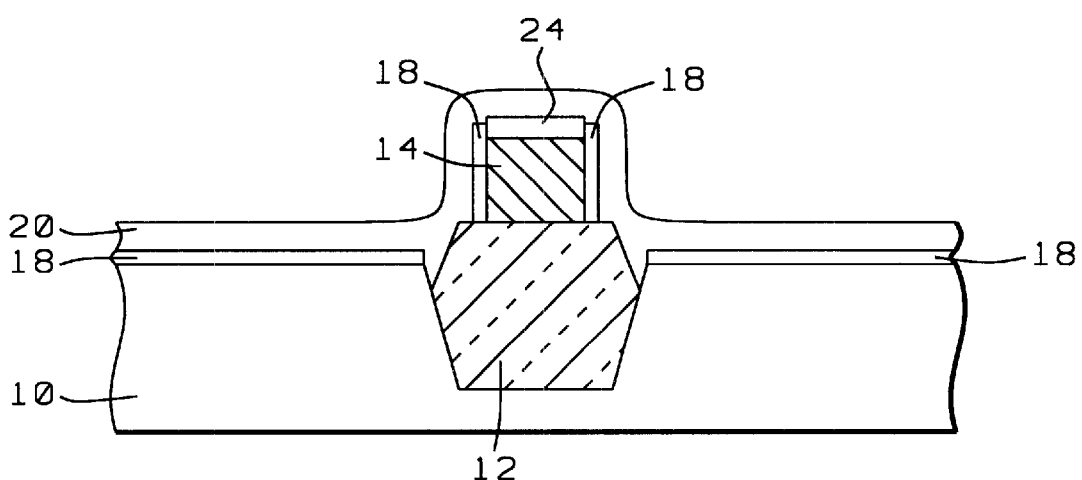
FIG. 12

METHOD FOR GATE FORMATION WITH IMPROVED SPACER PROFILE CONTROL

BACKGROUND OF THE INVENTION (1) Field of the Invention

The invention relates to the fabrication of integrated circuit devices, and more particularly, to a method that provides added and improved control over the profile of gate spacers that are created over sidewalls of a gate electrode.

(2) Description of the Prior Art

Presently existing CMOS technology is based on the creation of Field Effect Transistors (FET) over active surface regions of a silicon substrate, the created FET devices are electrically isolated by regions of isolation such as Shallow Trench Isolation regions. Creating Field Effect Transistor devices typically comprises creating regions of controlled conductivity in the surface of a substrate that are aligned with the gate electrode. Recognized in the creation of FET devices are first the creation of a layer of gate oxide over the surface of the substrate, a layer of gate material, typically comprising polysilicon, is deposited over the layer of gate oxide. Both layers of gate material and gate oxide are patterned and etched, creating the body of the gate electrode. Next and self-aligned with the body of the gate electrode, lightly doped impurity implantations are performed into the surface of the substrate, creating lightly doped diffusion (LDD) regions in the surface of the substrate for improved hot electron flow adjacent to the body of the gate electrode. Gate spacers are then formed over sidewalls of the body of the gate electrode after which source and drain impurity implantations are performed self-aligned with the body and the gate spacers of the gate electrode. Improved contact resistance can be achieved by saliciding the contact surfaces of the gate electrode, that is the surface of the source/drain regions and the top surface of the gate material. After the optional salicidation process has been completed, conductive contact plugs are established to the contact surfaces of the gate electrode through a layer of dielectric that is deposited over the surface of the substrate, thereby including the exposed surfaces of the created gate electrode.

Improved semiconductor device performance has over the years been provided by reducing device dimensions, thereby reducing the paths that need to be traveled by electron charges in addition to reducing such factors are resistive loss and parasitic influences that have a negative impact on device operational speed and functional performance. This continued reduction in the elements that collectively form an operational semiconductor device has imposed on the art of creating semiconductor devices increased demands of accuracy and control in creating the devices. A small deviation from a desired device element has a relative larger impact on the device performance if the small deviation constitutes a relative larger percentage of the design parameters of that device element. The invention specifically addresses the creation of gate spacers over sidewalls of the body of the gate electrode. In prior art applications of creating spacers for gate electrodes, the layer of gate material and gate oxide are etched by first creating a patterned and etched layer of hard mask material over these layers. The hard mask pattern protects the layers of gate material and gate oxide in a pattern of the body of the gate electrode. The problem that is encountered in etching the layers of gate material and gate oxide in this manner is that an overetch occurs into the surface of the isolation material that has been used to fill the STI trenches. This overetch typically occurs in the perimeter of the isolation material, where this isolation material interfaces with the surrounding silicon of the substrate. As a consequence, divots appear in the perimeter of the surface of the isolation material. The pattern of hard mask material is removed, a layer of gate spacer material is deposited over the surface of the patterned gate material and etched to create the gate spacers. Residue of gate spacer material will have been accumulated in the divots in the surface of the STI regions, this residue material must be removed, which causes loss of the now exposed layer of gate material. Complete removal of the gate spacer material from the divots in the STI surface is required for reasons of leakage currents and voltage isolation requirements. This complete removal of the accumulated gate spacer material however typically results in an excessive amount of loss of the exposed layer of gate material, making salicidation of the layer of gate material very problematic. The invention provides a method whereby this problem of accumulation of gate spacer material in divots in the surface of the isolation material in the STI trenches is prevented.

U.S. Pat. No. 5,923,991 (Bronner et al.) shows a process to prevent divots in the surface of the isolation material of STI trenches.

U.S. Pat. No. 5,741,738 (Mandelman et al.) shows a process to protect the surface of STI regions.

U.S. Pat. No. 6,207,513 (Vollrath) shows a spacer process to eliminate corner device in STI regions.

SUMMARY OF THE INVENTION

A principle objective of the invention is to create gate spacers over the sidewalls of patterned and etched layers of gate material such that the gate material is not excessively removed.

In accordance with the objectives of the invention a new process is provided for the creation of an improved gate spacer profile. A layer of hardmask material is patterned over the surface of a layer of gate material. The layer of gate material is etch in accordance with the patterned layer of hardmask material, reducing the thickness of the patterned layer of hardmask material. A liner oxide is formed, a film of gate spacer material is deposited over the liner material. The layer of spacer material is etched, forming gate spacers and at the same time the remaining layer of hardmask material.

BRIEF DESCRIPTION OF THE DRAWINGS

FIGS. 1 through 10 show prior art methods of creating a gate electrode in order to highlight therewith encountered problems of material accumulation. The process of salicidation is also highlighted.

FIGS. 11 through 14 are used to explain the invention, as follows:

FIG. 11 shows the cross section of a silicon substrate, a region of shallow Trench Isolation has been formed over the substrate, a gate electrode having a layer of hardmask material as upper layer is formed over the surface of the created STI region.

FIG. 12 shows the cross section after creation of a layer of liner oxide and the deposition of a layer of gate spacer material.

FIG. 13 shows the cross section of the structure after gate spacers have been formed over the sidewalls of the gate electrode, foreign matter has accumulated in divots in the surface of the STI region.

FIG. 14 shows a cross section of the gate electrode created by the invention.

DESCRIPTION OF THE PREFERRED EMBODIMENTS

Figure 13:
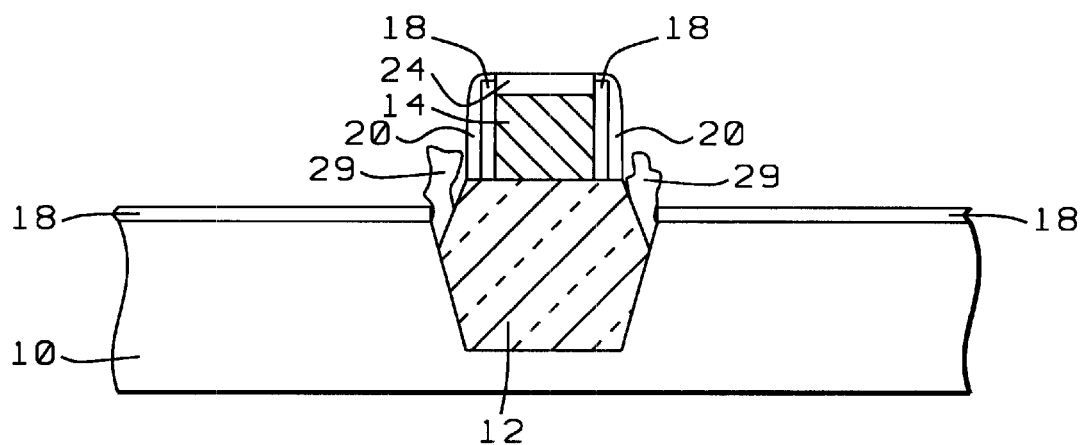
Figure 14:
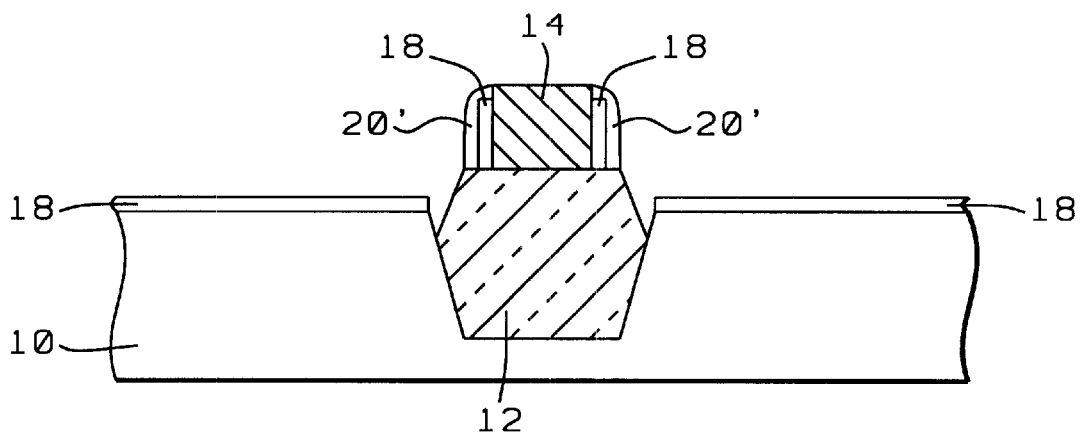

The previously briefly highlighted creation of a conventional CMOS device is shown in the cross section of FIG. 1. Specifically shown in the cross section of FIG. 1 are:

10, the cross section of the surface of a substrate 12, two STI regions defined in the surface of the substrate 10, these STI regions 12 electrically isolate the gate electrode 13 from other semiconductor devices (not shown) created on the surface of substrate 10

13, a CMOS device created on the surface of substrate 10

14, the body or gate material of the gate electrode of the CMOS device 13

16, a layer of pad oxide formed over the surface of substrate 10 prior to the formation of the gate electrode 13

18, a layer of liner oxide created over the surface of the substrate 10, including exposed surfaces of the gate electrodes 13

20, a layer of nitride deposited over the surface of the layer 18 of liner oxide.

Typically, a blanket layer 16 of pad oxide can be formed over the surface of a silicon substrate through a thermal oxidation method at a temperature of about 900 degrees C. for a time period of about 10 to 20 minutes. A layer of pad oxide is typically formed to a thickness of between about 50 and 150 Angstrom.

For the creation of a typical gate electrode such as gate electrode 13 shown in cross section in FIG. 1, a layer of polysilicon is deposited over the layer 16 of gate oxide and etched using photolithography followed by anisotropic poly etch. The etch to form the body 14 of the gate electrode 13 removes the layer 14 of poly and the layer 16 of gate oxide from above the surface of substrate 10 in accordance with the pattern of the gate electrode 13.

After the layer 14 and 16 have been patterned and etched, a self-aligned LDD implant (not shown) is performed into the surface of the substrate 10.

Layer 18 is a layer of liner oxide, layer 20 is a layer of silicon nitride. Combined, these two layer form a passivation layer over the surface of the substrate 10 and the gate electrode 13. Passivation layers typically contain an oxide or nitride, they can also contain $SiO_2$ that is deposited by plasma at low temperatures, a SACVD oxide layer, a plasma enhanced nitride layer, a LPCVD oxide. Silicon nitride is used as a passivation layer due to its ability to provide an impermeable barrier to moisture and mobile impurities (e.g. sodium ions). Silicon nitride also forms a tough coating that protects an underlying integrated circuit against mechanical damage.

Layer 18 of liner oxide is native oxide or thermally grown oxide or CVD deposited oxide, to a thickness of between about 100 and 500 Angstrom, layer 20 of nitride is deposited next.

Layer 20 of silicon nitride is deposited over the surface of the liner oxide 18. The layer 20 of silicon nitride ($Si_3N_4$) can be deposited using LPCVD or PECVD procedures at a pressure between about 300 mTorr and 400 mTorr, at a temperature between about 600 and 800 degrees C., to a thickness of between about 2,000 and 3,000 Angstrom using $NH_3$ and $SiH_4$. The silicon nitride layer 20 can also be deposited using LPCVD or PECVD procedures using a reactant gas mixture such as dichlorosilane ($SiCl_2H_2$) and amonia ($NH_3$).

Gate spacers for gate electrodes are typically created using a variety of materials such as silicon oxide, BSG, PSG, other materials preferably of a dielectric nature, CVD oxide formed from a TEOS source.

FIG. 2 shows a cross section of the structure of FIG. 1 after the layer 20 of silicon nitride has been etched, stopping on the layer 18 of oxide liner. Shown in FIG. 2 are spacers 22 of silicon nitride created on the sidewalls of the gate electrode 13. The preferred method of the invention for the etch of the layer 20 of silicon nitride is a dry etch such as applying an RIE etch using $CHF_3$ or $SF_6$—$O_2$ as an etchant.

After the gate spacers 22 have been created as shown in cross section in FIG. 2, the layer 18 of liner oxide liner is typically removed from the surface of substrate 10 where the surface of this layer 18 is exposed. This process of removal can be performed by etching layer 18 (FIG. 2) using $Ar/CF_4$ as an etchant at a temperature of between about 120 and 160 degrees C. and a pressure of between about 0.30 and 0.40 Torr for a time of between about 33 and 39 seconds using a dry etch process. Silicon oxide layer 18 can also be etched via anisotropic RIE of the silicon oxide layer 50, using $CHF_3$ or $CF_4$—$O_2$—He as an etchant. The results of this latter etch are shown in cross section in FIG. 3.

The cross sections that are shown in FIGS. 4 through 8 more specifically present the problem that is addressed by the invention.

The cross section of FIG. 4 shows the now familiar cross section of a patterned and etch layer 14 of gate material (the layer of gate oxide has for reasons of clarity not been shown in the cross sections of FIGS. 4 through 8), in this instance the patterned and etched layer 14 of gate material has been formed overlying the surface of a layer 12 of insulation oxide that fills an STI trench created in the surface of substrate 10. Overlying the layer 14 of gate material is a layer 24 of patterned and etched organic Bottom-Anti-Reflective Coating (BARC) or Dielectric-Anti-Reflective Coating (DARC) material that has served as a hard mask for the etching of the layer 14 of gate material.

A layer of BARC can be either opaque or translucent and is typically applied for its non-light-reflective and none-transmitting electromagnetic radiation characteristics. A typical layer 24 of BARC can be formed by depositing silicon-oxynitride (SiON) or silicon nitride ($Si_3Ni_4$) or organic BARC. The patterning and etching of the layer 24 of BARC can be accomplished by performing a timed removal with a recipe comprising $O_2/N_2$.

Specifically highlighted in the cross section of FIG. 4 are divots 25 that are formed in the perimeter of the layer 12 of isolation oxide where this isolation oxide interfaces with the silicon substrate 24. Divots 25 are undesirably created as part of the wet etch processing that is performed in order to create the cross section that is shown in FIG. 4. The depth of divots 25 can range between about 100 and 1,000 Angstrom, dependent on the process flow that is applied for the creation of the cross section of FIG. 4.

The cross section of FIG. 5 shows the removal of the hardmask layer 24 from the surface of the patterned and etched layer 14 of gate material. This removal can be accomplished using any of the conventional and above cited methods for the removal of layer of BARC material, further including applying methods of Chemical Mechanical Polishing (CMP).

It must be noted at this point that the gate parameters of gate height and gate length are interrelated whereby the gate height is scaled to the gate length. The gate height is understood as being the distance between the surface of the layer 12 of isolation oxide and the top surface of the layer 14 of patterned gate material. The gate width is the length of the interface between the surface of the layer 12 of gate isolation oxide and the overlying layer 14 of the gate material. The gate height can vary from for instance 1,800 Angstrom to 1,500 Angstrom to 1,200 Angstrom, dependent on the product design and the therewith imposed gate width as defined above. The sequence in proceeding from FIG. 4 to FIG. 5 indicates that during conventional processing, the patterned and etched layer 24 of hardmask material is removed after the layer 14 of gate material has been etched.

FIG. 6 shows a cross section after layer 18 of liner oxide and layer 20 of gate spacer material have been deposited over the exposed surfaces that are shown in cross section in FIG. 5. The processing conditions for the creation of the two layers 18 of liner oxide and layer 20 of gate spacer material have previously been highlighted using FIG. 1 and will therefore not be further discussed at this time.

Specifically highlighted in the cross section of FIG. 6 are regions 27 where the deposited layer 20 overlies the divots 25 and where this layer 20 therefore forms a relatively thick layer of gate spacer material overlying the surface of the substrate 10.

The gate spacer etch will next be applied, the results of which are shown in cross section in FIG. 7, creating gate spacers 20 overlying the sidewalls of the gate material 14 with the interposition of the layers of liner oxide 18.

Specifically highlighted in the cross section of FIG. 7 are the deposits 29 that have accumulated in divots 25, this residue essentially comprises remnant of the gate spacer material, typically silicon nitride.

This residue 29 of essentially gate spacer material must, for reasons of device performance requirements of which leakage current requirements and device isolation are the essential components, be removed.

As a final cross section that relates to prior art practices of creating a sub-micron gate electrode, the cross section of FIG. 8 shows two gate electrode 30 and 31. The gate electrode 31 is a gate electrode that has, in accordance with the cross sections of FIGS. 4 through 7, been created over the surface of an STI region while gate electrode 30 has been created over the surface of a substrate 10. Both gate electrodes 30 and 31 are shown in the cross section of FIG. 8 to highlight that the concern that is addressed by the invention is not limited to a gate electrode that is created over an STI region. The concern equally applies to gate electrodes created over the surface of a substrate.

The removal of the hard mask layer 24 brings with it depositions of residue 29, FIG. 7, of gate spacer material. The removal of this residue material 29, FIG. 7, causes a relatively large loss of the top region of the material of gate spacers 20. This latter occurring to such an extent that the conventional process of saliciding the surface of the gate electrode material is no longer possible without dramatically and negatively affecting a salicide induced gate leakage.

Salicided layers 32 are shown in cross section in FIG. 9 which shows the effect of the salicidation for a relatively high layer 14 of gate material while the cross section of FIG. 10 shows the effect of salicidation for a relatively low layer of gate material 14.

For the cross section of FIG. 9, having a gate electrode 30' of relatively large height as previously defined, the forming of the salicided layers 32' does not remove the top regions of the gate spacers 20 to such an extent that concerns of leakage current or electrical shorting between the salicided layers 32' and the salicided surfaces of the surrounding source/drain regions (not shown) or the isolation material of the STI trenches raises a concern.

This is not the case for the gate electrodes 30" and 31" that are shown in cross section in FIG. 10. The gate electrodes 30" and 31" are of relatively small height (scaled down in accordance with the channel length of the gate electrodes 30" and 31"). The forming of the salicided layers 32" removes the top regions of the gate spacers 20 to such an extent that concerns of leakage current or electrical shorting between the salicided layers 32" and the salicided surfaces of the surrounding source/drain regions (not shown) and the isolation material 12 in the STI trenches raises a concern. The invention addresses this concern.

The invention will now be described in detail using FIGS. 11 through 14.

Referring now specifically to the cross section that is shown in FIG. 11, there is shown the now familiar cross section of a gate electrode that has been formed over the surface of the isolation layers 12 that has been deposited inside STI trenches in the surface of substrate 10. Layer 14 is a patterned and etched layer of gate material such as polysilicon, overlying layer 14 is a patterned and etched layer 24 which is a layer of hardmask material, preferably a layer of silicon nitride that has been deposited to a thickness between about 200 and 600 Angstrom. The previously highlighted divots 25 are also highlighted in the cross section of FIG. 11.

For many applications of a layer of Etch Stop Layer (ESL) or hardmask layer 24 a material can be selected that comprises a silicon component, for instance dielectrics such as silicon dioxide ("oxide", doped or undoped) or silicon nitride ("nitride"), silicon oxynitride, silicon carbide (SiC), silicon oxycarbide (SiOC) and silicon nitro carbide (SiNC).

The preferred material of the invention for the creation of the hard mask layer 24 of FIG. 11 is silicon nitride ($Si_3N_4$) or SiON or an Oxide or a composite thereof for the layer of hardmask material. An alternate material that can be used for the creation of hardmask layer 24 is boron nitride. A layer 24 of said silicon nitride layer may be conventionally deposited using LPCVD or PECVD procedures, at a temperature between about 200 and 800 degrees C., to a thickness between about 200 and 1,000 Angstrom. The deposited layer 24 of hardmask material is reduced to a thickness of between about 200 and 600 Angstrom after the etch, of layer 14 of gate material has been completed.

The deposited layer 24 of silicon nitride can be etched to form the hardmask layer 24 by anisotropic RIE of the deposited layer of silicon nitride, using $CHF_3$ or $SF_6$—$O_2$ as an etchant.

The preferred material of the invention for the layer 14 of gate material comprises polysilicon, amorphous silicon, SiGe, metal or a composite layer of gate material and is preferably deposited to a thickness between about 3,000 and 7,000 Angstrom.

A layer 24 of polysilicon can be grown at a temperature between 600 and 640 degrees C. using LPCVD to a thickness that is design dependent and essentially determined by the channel length of the gate electrode that is being created with as examples a thickness of about 1,800 Angstrom or about 1,500 Angstrom or about 1,200 Angstrom.

A layer 14 of gate material of polysilicon may conventionally be etched by using an anisotropic plasma etch, for example a Reactive Ion Etch (RIE), using as etchant gasses a gas such as hydrogen bromide (HBr) or chlorine ($Cl_2$) and a carrier gas such as argon (Ar) with as preferred gasses $SF_6$ and HBr.

A layer of gate oxide (not shown in FIG. 11) is preferably created underlying gate structure 14 using oxide or SiON or nitridized oxide or a high-k dielectric material, created to a thickness between about 50 and 150 Angstrom.

For the gate etch of deposited layers 14 of gate material and the underlying layer (not shown) of gate oxide, this etch can be performed using either a patterned layer of hardmask material or a photoresist mask overlying the layer of gate material.

FIG. 12 shows a cross section highlighting a layer 18 of liner oxide and a layer 20 of gate spacer material that have been deposited over the surface of the structure that is shown in cross section in FIG. 11. The layer 18 of liner oxide has been shown in the cross section of FIG. 12 overlying the substrate 10 and the sidewalls of the gate electrode structure 18. This because effectively the layer 18 of gate liner oxide is from a processing point of view absorbed into the layer 12 of isolation oxide at the time of the creation of the layer 18 of liner oxide. The liner oxide is therefore from a processing point of view of importance only where this layer remains as a separate entity of the gate electrode structure, as shown in the cross section of FIG. 12.

The layers 18 of liner oxide can be formed to a thickness between about 100 and 500 Angstrom by thermally growing of a thin oxide over sidewalls of the gate electrode and over the surface of the substrate 10, using a short dry-oxidation process whereupon a conformal CVD oxide film is deposited by decomposing TEOS at between 700 and 750 degrees C.

The preferred method of the invention for the creation of layer 18 of liner oxide is by blanket deposition of the layer or by selectively growing thermal oxide over the sidewalls of patterned and etch layer 14 of gate material and the surface of the substrate. The more preferred method is the method of growing thermal oxide over the sidewalls of patterned and etch layer 14 of gate material and the surface of the substrate. The liner oxide 18 is not grown overlying the hardmask 24, as highlighted in the cross section of FIG. 12. The film 20 of gate spacer material is deposited after the layer 18 of liner oxide has been created.

Gate spacer materials that are conventionally used in the art comprise silicon nitride, silicon oxide, BSG, PSG, polysilicon, other materials preferably of a dielectric nature, CVD oxide formed from a TEOS source while amorphous materials that inhibit the deposition of epitaxial silicon thereupon are also frequently used for the purpose of creating gate spacers.

The preferred material of the invention for the layer 20 of spacer material is silicon nitride or SiON or oxide or a composite thereof with most preferably using silicon nitride, the most preferred material is silicon nitride, deposited to a thickness between about 200 and 1,000 Angstrom.

FIG. 13 shows the cross section of the structure after the gate spacers 20 have been formed over the sidewalls of the gate electrode 14. Noted must be in the cross section of FIG. 13 that the hardmask layer 24 has remained in place during the etch of layer 20, FIG. 12, to create the gate spacers 20 as shown in cross section in FIG. 13. Prior art processing, see FIGS. 4 and 5, remove the hardmask layer prior to the etch for the formation of the gate spacers.

For the etch of the layer of gate spacer material of the invention preferably is applied $C_xF_yH_z$ plus oxygen to etch a nitride containing layer of gate spacer material. Examples of the applied $C_xF_yH_z$ are $CF_4$ and $CHF_3$ and $CH_2F_2$ and $CH_3F$, the flow rate for the applied $C_xF_yH_z$ is between about 10 and 80 sccm at a pressure of between about 5 and 150 mTorr.

The etch of layer 20, for the formation of gate spacers 20, FIG. 13, has again deposited residue of gate spacer material, for instance silicon nitride, in regions 29 which are the regions where divots 25, FIG. 11, have previously been formed.

From the cross section that is shown in FIG. 13, it can be observed that the exposed surfaces of depositions 24, the hardmask layer, the gate spacers 20 and the residue 29 essentially comprise silicon nitride. This makes possible the simultaneous etching of these layers for the removal of these layers, that is the removal of the undesirable residue 29 and the removal of the now no longer needed layer 24 of hardmask material. This latter removal can be achieved by applying an overetch of the conventional etch of the layer 20, that is after the gate spacers 20 of FIG. 13 have been created. The etch that has been applied under the previously indicated processing conditions is further continued to the point where layers 29 (of $Si_3N_4$ residue) and 24 (of $Si_3N_4$ hardmask material) have been removed, in the process further lowering the height of the gate spacers by the thickness of the layer 24 of hardmask material. The essential point of this processing sequence is that where previously the residue 29 was removed while the layer 14 of gate material was exposed (FIG. 7), causing the height of the layer 14 of gate material and the height of the gate spacers 20, FIG. 8) to be decreased, the invention provides a method whereby the residue 29 is removed while the layer of gate material 14, FIG. 13, is protected by the layer 24 of hardmask material.

The residue of gate spacer material, FIG. 13, is removed at the same time that the hardmask layer 24 is removed, in the process protecting the layer 14 of gate material and therefore not simultaneously reducing the height of the gate material 14 and the height of the gate spacers 20. The height of the layer 14 of gate material therefore essentially remains unaffected by the removal of the residue 29, FIG. 13, and the hardmask layer 24, FIG. 13. The final structure, with gate spacers 20', created in this manner is shown in cross section in FIG. 14.

To summarize the invention:

a substrate is provided deposit a layer of gate material over the surface of the substrate deposit a layer of hardmask material over the surface of the layer of gate material to a thickness between about 200 and 1,000 Angstrom form at least one gate electrode over the surface of the substrate, leave the layer of hardmask material in place overlying the patterned and etched layer of gate material to a thickness between about 200 and 600 Angstrom deposit a layer of gate spacer material, and etch the deposited layer of gate space material, simultaneously removing the layer of hardmask material.

Processing and material preferences of the invention are as follows:

use SiN or SiON or an Oxide or a composite thereof for the layer of hardmask material form the gate stack using a layer of gate material over which optionally a layer of BARC is deposited a layer of gate material preferably comprises polysilicon, amorphous silicon, SiGe, metal or a composite layer of gate material and is preferably deposited to a thickness between about 3,000 and 7,000 Angstrom underlying the layer of gate material is a layer of gate oxide the layer of gate oxide is preferably created using oxide or SiON or nitridized oxide or a high-k dielectric material for the gate etch, this etch can be performed using either a patterned layer of hardmask material or a photoresist mask overlying the layer of gate material the layer of liner oxide can be a deposited layer of oxide or this layer can be selectively grown by a thermal oxidation process over sidewalls of the patterned layer of gate material such as polysilicon without being grown on the hardmask layer, the preferred method is to grow thermal oxide the layer of gate spacer material is deposited after the liner oxide has been created the material that is used for the gate spacer is preferably silicon nitride or SiON or oxide or a composite thereof with most preferably using silicon nitride the thickness of the created layer of gate spacer material is between about 200 and 1,000 Angstrom for the etch of the layer of gate spacer material preferably is applied $C_xF_yH_z$ plus oxygen to etch a nitride containing layer of gate spacer material examples of the applied $C_xF_yH_z$ are $CF_4$ and $CHF_3$ and $CH_2F_2$ and $CH_3F$; flow rate for the applied $C_xF_yH_z$ is between about 10 and 80 sccm at a pressure of between about 5 and 150 mTorr a layer of gate oxide is preferably created to a thickness between about 50 and 150 Angstrom, and liner oxide is preferably created to a thickness between about 100 and 500 Angstrom.

Processing steps for the creation of a gate electrode structure with improved profile control of the invention can be summarized as follows:

providing a substrate, the substrate having been provided with at least one region of Shallow Trench Isolation (STI) over the surface thereof creating a layer of gate oxide over the surface of the substrate, thereby including the surface of the at least one STI region provided over the surface of the substrate depositing a layer of gate material over the surface of the layer of gate oxide depositing a layer of hardmask material over the surface of the layer of gate material to a first thickness patterning and etching the layer of hardmask material and the layer of gate material, creating at least one first gate electrode over the surface of the substrate, further creating at least one second gate electrode over the surface of the region of Shallow Trench Isolation, the first and second gate electrodes comprising a patterned layer of gate material over which a patterned layer of hardmask material remains in place to a second thickness creating a layer of liner oxide over sidewalls of the patterned and etched layer of gate material and over the surface of the substrate depositing a layer of gate spacer material over the surface of the layer of liner oxide, and etching the deposited layer of gate spacer material, thereby creating gate spacers overlying sidewalls of the patterned and etched layer of gate material, thereby furthermore removing the patterned layer of hardmask material overlying the patterned and etched layer of gate material.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a gate electrode structure with improved profile control, comprising the steps of:

providing a substrate, said substrate having been provided with at least one region of Shallow Trench Isolation (STI) over the surface thereof;

creating a layer of gate oxide over the surface of said substrate, thereby including the surface of said at least one STI region provided over the surface of said substrate;

depositing a layer of gate material over the surface of said layer of gate oxide;

depositing a layer of hardmask material over the surface of said layer of gate material to a first thickness;

creating at least one first gate electrode over the surface of said substrate, further creating at least one second gate electrode over the surface of said region of Shallow Trench Isolation, said first and second gate electrodes comprising a patterned layer of gate material over which a patterned layer of hardmask material remains in place to a second thickness;

creating a layer of liner oxide over sidewalls of said patterned and etched layer of gate material and over the surface of said substrate;

depositing a layer of gate spacer material over the surface of said layer of liner oxide; and etching the deposited layer of gate spacer material, thereby creating gate spacers overlying sidewalls of said patterned and etched layer of gate material, thereby furthermore removing said patterned layer of hardmask material overlying said patterned and etched layer of gate material.

2. The method of claim 1, said layer of gate oxide comprising a material selected from the group consisting of oxide and SiON and nitridized oxide and a high-k dielectric material.

3. The method of claim 1, said layer of gate oxide being created to a thickness between about 5 and 150 Angstrom.

4. The method of claim 1, said layer of gate material comprising a material selected from the group consisting of polysilicon and amorphous silicon and SiGe and metal and a composite layer of gate material.

5. The method of claim 1, said layer of gate material being deposited to a thickness between about 500 and 4,000 Angstrom.

6. The method of claim 1, said layer of hardmask material comprising a material selected from the group consisting of silicon nitride ($Si_3N_4$) and SiON and an Oxide and a composite thereof.

7. The method of claim 1, said first thickness of said hardmask material being between about 200 and 1,000 Angstrom.

8. The method of claim 1, said second thickness of said hardmask material being between about 200 and 600 Angstrom.

9. The method of claim 1, said patterning and etching said layer of hardmask material and said layer of gate material comprising patterning and developing a layer of photoresist deposited over the surface of said layer of hardmask material applying methods of photolithography.

10. The method of claim 1, said layer of hardmask material comprising a layer of BARC material.

11. The method of claim 1, creating a layer of liner oxide comprising thermally growing of a thin layer of oxide over sidewalls of the patterned and etched layer of gate material and over the surface of the substrate.

12. The method of claim 11, said thermally growing of a thin layer of oxide comprising a short dry-oxidation process whereupon a conformal CVD oxide film is deposited by decomposing TEOS at between 700 and 750 degrees C.

13. The method of claim 1, creating a layer of liner oxide comprising blanket deposition of layer of oxide or by selectively growing thermal oxide over sidewalls of the patterned and etch layer of gate material and the surface of said substrate.

14. The method of claim 1, said layer of liner oxide being formed to a thickness between about 30 and 300 Angstrom.

15. The method of claim 1, said layer of gate spacer material comprising a material selected from the group consisting of silicon nitride and SiON and oxide and a composite thereof and more preferably comprising silicon nitride.

16. The method of claim 1, said layer of gate spacer material being deposited to a thickness between about 200 and 1,000 Angstrom.

17. The method of claim 1, said etching the deposited layer of gate spacer material comprising applying $C_xF_yH_z$ plus oxygen.

18. The method of claim 17, said $C_xF_yH_z$ plus oxygen being applied at a flow rate between about 10 and 300 sccm and a pressure of between about 5 and 150 mTorr.

19. The method of claim 1, said etching the deposited layer of gate spacer material comprising applying an etchant selected from the group consisting of $CF_4$ and $CHF_3$ and $CH_2F_2$ and $CH_3F$.

20. A method for the creation of a gate electrode structure with improved profile control, comprising the steps of:
   providing a substrate, said substrate having been provided with at least one region of Shallow Trench Isolation (STI) over the surface thereof;
   creating at least one first hardmask pattern to a first thickness for the creation of at least one first gate electrode over the surface of said substrate, in addition creating at least one second hardmask pattern for the creation of at least one second gate electrode over the surface of said region of Shallow Trench Isolation;
   creating said at least one first gate electrode and said at least one second gate electrode, reducing said first thickness of said hardmask pattern to a second thickness;
   forming a layer of liner oxide overlying sidewalls of said at least one second gate electrode, further overlying the surface of said substrate;
   depositing a layer of gate spacer material over the surface of said layer of liner oxide; and
   etching said layer of gate spacer material.

21. The method of claim 20, said creating at least one first hardmask pattern to a first thickness in addition to creating at least one second hardmask pattern to a first thickness comprising the steps of:
   creating a layer of gate oxide over the surface of said substrate, thereby including the surface of said at least one STI region provided over the surface of said substrate;
   depositing a layer of gate material over the surface of said layer of gate oxide;
   depositing a layer of hardmask material over the surface of said layer of gate material to a first thickness; and
   patterning and etching said layer of hardmask material, creating at least one first hardmask pattern overlying said layer of gate material and being aligned with at least one first gate electrode being created over the surface of said substrate, further creating at least one second hardmask pattern overlying said layer of gate material and being aligned with at least one second gate electrode being created over the surface of said region of Shallow Trench Isolation.

22. The method of claim 20, said creating said at least one first gate electrode and said at least one second gate electrode comprises etching a layer of gate material in accordance with said at least one first hardmask pattern and further in accordance with said at least one second hardmask pattern.

23. The method of claim 22, said first and second gate electrodes comprising a patterned and etched layer of gate material over which a first hardmask pattern and a second hardmask pattern material remain in place to a second thickness.

24. The method of claim 20, said etching said layer of gate spacer material comprising etching the deposited layer of gate spacer material, thereby creating gate spacers overlying sidewalls of said at least one first gate electrode and at least one second gate electrode, thereby furthermore removing said at least one first hardmask pattern and said at least one second hardmask pattern.

25. The method of claim 21, said layer of gate oxide comprising a material selected from the group consisting of oxide and SiON and nitridized oxide and a high-k dielectric material.

26. The method of claim 21, said layer of gate oxide being created to a thickness between about 50 and 150 Angstrom.

27. The method of claim 21, said layer of gate material comprising a material selected from the group consisting of polysilicon and amorphous silicon and SiGe and metal and a composite layer of gate material.

28. The method of claim 21, said layer of gate material being deposited to a thickness between about 3,000 and 7,000 Angstrom.

29. The method of claim 21, said layer of hardmask material comprising a material selected from the group consisting of silicon nitride ($Si_3N_4$) and SiON and an Oxide and a composite thereof.

30. The method of claim 21, said first thickness of said hardmask material being between about 200 and 1,000 Angstrom.

31. The method of claim 23, said second thickness of said hardmask material being between about 200 and 600 Angstrom.

32. The method of claim 21, said patterning and etching said layer of hardmask material comprising patterning and developing a layer of photoresist deposited over the surface of said layer of hardmask material applying methods of photolithography.

33. The method of claim 21, said layer of hardmask material comprising a layer of BARC material.

34. The method of claim 21, creating a layer of liner oxide comprising thermally growing of a thin layer of oxide over sidewalls of the patterned and etch layer of gate material and over the surface of the substrate.

35. The method of claim 34, said thermally growing of a thin layer of oxide comprising a short dry-oxidation process whereupon a conformal CVD oxide film is deposited by decomposing TEOS at between 700 and 750 degrees C.

36. The method of claim 21, creating a layer of liner oxide comprising blanket deposition of layer of oxide or by selectively growing thermal oxide over sidewalls of the patterned and etch layer of gate material and the surface of said substrate.

37. The method of claim 21, said layer of liner oxide being formed to a thickness between about 100 and 500 Angstrom.

38. The method of claim 20, said layer of gate spacer material comprising a material selected from the group consisting of silicon nitride and SiON and oxide and a composite thereof and more preferably comprising silicon nitride.

39. The method of claim 20, said layer of gate spacer material being deposited to a thickness between about 200 and 1,000 Angstrom.

40. The method of claim 20, said etching the deposited layer of gate spacer material comprising applying $C_xF_yH_z$ plus oxygen.

41. The method of claim 40, said $C_xF_yH_z$ plus oxygen being applied at a flow rate between about 10 and 80 sccm and a pressure of between about 5 and 150 mTorr.

42. The method of claim 20, said etching the deposited layer of gate spacer material comprising applying an etchant selected from the group consisting of $CF_4$ and $CHF_3$ and $CH_2F_2$ and $CH_3F$.

* * * * *